US012763734B2

(12) United States Patent
Ramesh et al.

(10) Patent No.: US 12,763,734 B2
(45) Date of Patent: Oct. 13, 2026

(54) APPARATUS AND METHODS TO PROTECT POWER AMPLIFIERS

(71) Applicant: Texas Instruments Incorporated, Dallas, TX (US)

(72) Inventors: Goutham Ramesh, Bangalore (IN); Sarma Sundareswara Gunturi, Bangalore (IN); Ram Narayan Krishna Nama Mony, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 421 days.

(21) Appl. No.: 18/429,088

(22) Filed: Jan. 31, 2024

(65) Prior Publication Data

US 2025/0158577 A1 May 15, 2025

(30) Foreign Application Priority Data

Nov. 9, 2023 (IN) ............................ 202341076646

(51) Int. Cl.
*H03F 1/52* (2006.01)

(52) U.S. Cl.
CPC ......... *H03F 1/52* (2013.01); *H03F 2200/228* (2013.01); *H03F 2200/451* (2013.01)

(58) Field of Classification Search
CPC . H03F 1/52; H03F 2200/228; H03F 2200/451
USPC ........................................................ 330/298
See application file for complete search history.

(56) References Cited

U.S. PATENT DOCUMENTS

2006/0170499 A1* 8/2006 Rahman ............... H03G 3/3047 330/279
2015/0236658 A1* 8/2015 Nash ......................... H03F 1/52 330/298
2023/0096011 A1* 3/2023 Scott ..................... H03F 1/0222 330/127
2023/0318534 A1* 10/2023 Shen ....................... H03F 3/211 330/295
2024/0364282 A1* 10/2024 Scoles ..................... H03F 3/245

* cited by examiner

*Primary Examiner* — Hafizur Rahman
(74) *Attorney, Agent, or Firm* — Xianghui Huang; Frank D. Cimino

(57) ABSTRACT

An example apparatus includes first interpolation circuitry; second interpolation circuitry; first frequency band envelope determination circuitry having an input coupled to the first interpolation circuitry, and having an output; second frequency band envelope determination circuitry having an input coupled to the second interpolation circuitry, and having an output; combiner circuitry having a first input coupled to the output of the first frequency band envelope determination circuitry, having a second input coupled to the output of the second frequency band envelope determination circuitry, and having an output; and signal monitor circuitry having an input coupled to the output of the combiner circuitry.

20 Claims, 8 Drawing Sheets

APPARATUS AND METHODS TO PROTECT POWER AMPLIFIERS

CROSS-REFERENCE TO RELATED APPLICATION

This patent application claims the benefit of and priority to Indian Provisional Patent Application No. 202341076646 filed Nov. 9, 2023, which Application is hereby incorporated herein by reference in its entirety.

TECHNICAL FIELD

This description relates generally to circuits and, more particularly, to apparatus and methods to protect power amplifiers.

BACKGROUND

In communication applications, a transmit signal is amplified using a power amplifier (PA) so that the transmit signal has sufficient power to reach its destination. Signals input to the power amplifier can have varying levels of power before such amplification.

SUMMARY

For methods, apparatus, systems, and articles of manufacture to protect power amplifiers, an example apparatus includes first interpolation circuitry, second interpolation circuitry, first frequency band envelope determination circuitry having an input coupled to the first interpolation circuitry, and having an output, second frequency band envelope determination circuitry having an input coupled to the second interpolation circuitry, and having an output, combiner circuitry having a first input coupled to the output of the first frequency band envelope determination circuitry, having a second input coupled to the output of the second frequency band envelope determination circuitry, and having an output, and signal monitor circuitry having an input coupled to the output of the combiner circuitry. Other examples are described.

For methods, apparatus, systems, and articles of manufacture to protect power amplifiers, an example apparatus includes power amplifier circuitry having an input, digital-to-analog converter circuitry having an output coupled to the input of the power amplifier circuitry, and having an input, multiplier circuitry having an output coupled to the input of the digital-to-analog converter circuitry, and having a first input and a second input, first combiner circuitry having an output coupled to the first input of the multiplier circuitry, and having a first input and a second input, first mixer circuitry having an output coupled to the first input of the first combiner circuitry, and having an input, second mixer circuitry having an output coupled to the second input of the first combiner circuitry, and having an input, first interpolation circuitry having an output coupled to the input of the first mixer circuitry, and having an input, second interpolation circuitry having an output coupled to the input of the second mixer circuitry, and having an input, first frequency band envelope determination circuitry having an input coupled to the first interpolation circuitry, and having an output, second frequency band envelope determination circuitry having an input coupled to the second interpolation circuitry, and having an output, second combiner circuitry having a first input coupled to the output of the first frequency band envelope determination circuitry and a second input coupled to the output of the second frequency band envelope determination circuitry, and having an output, and signal monitor circuitry having an input coupled to the output of the second combiner circuitry. Other examples are described.

For methods, apparatus, systems, and articles of manufacture to protect power amplifiers, an example apparatus includes frequency band envelope determination circuitry configured to determine an envelope corresponding to a first band signal, and having an output, combiner circuitry having an input coupled to the output of the frequency band envelope determination circuitry and configured to generate a combined envelope signal by combining the envelope corresponding to the first band signal with an envelope corresponding to a second band signal, and having an output, signal monitor circuitry configured to determine that the combined envelope signal satisfies a damage criterion of a power amplifier, and having an output, controller circuitry having an input coupled to the output of the signal monitor circuitry and configured to generate a power reduction value, and having an output, and multiplier circuitry having a first input coupled to the output of the controller circuitry, the multiplier circuitry configured to reduce a power of a combined radio frequency (RF) signal based on the power reduction value, the combined RF signal corresponding to the combined envelope signal. Other examples are described.

DETAILED DESCRIPTION

Figure 1:
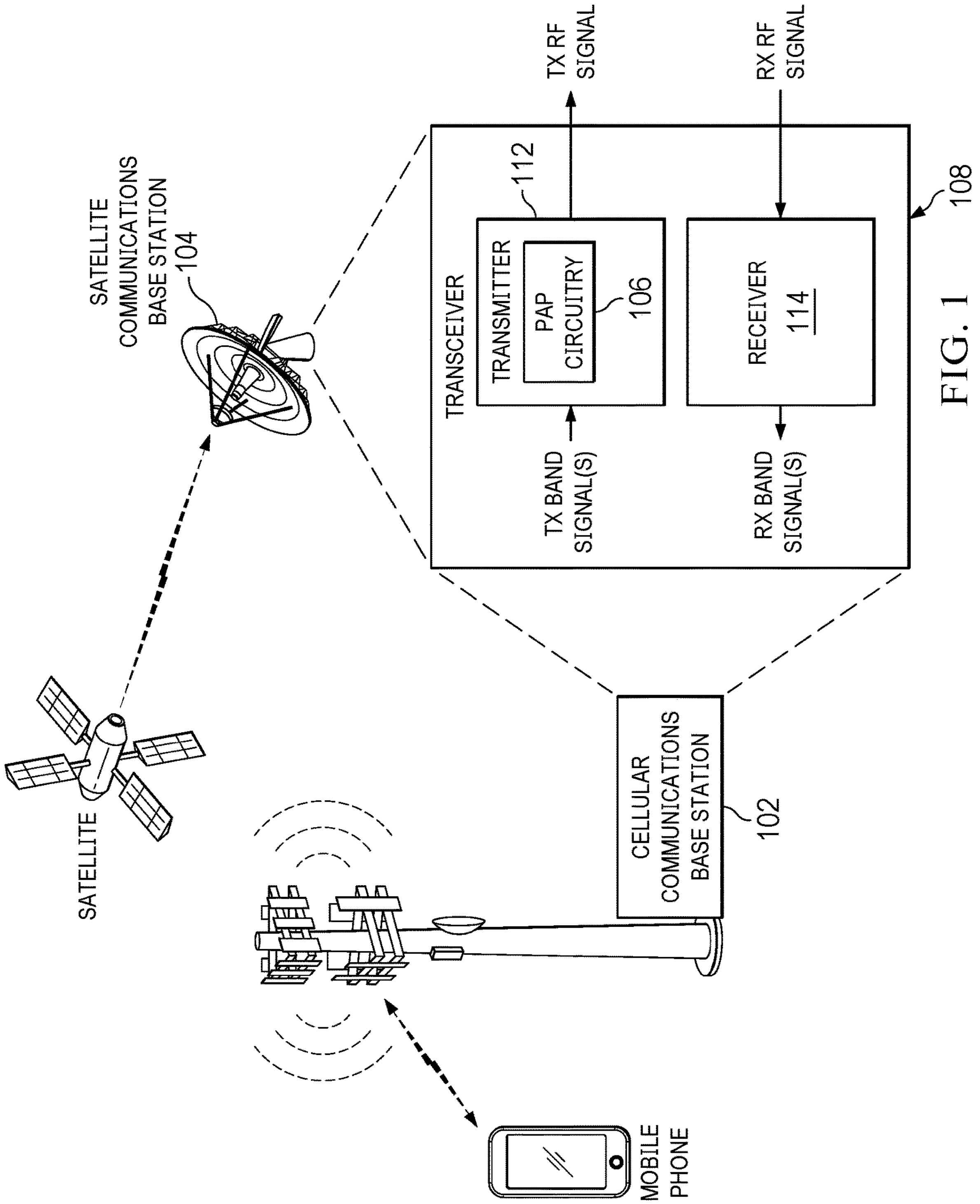
FIG. 1 depicts example communication system environments in which power amplifier protection (PAP) circuitry described herein may be implemented.

In general, the same reference numbers will be used throughout the drawings and accompanying written description to refer to the same or like parts. The figures are not necessarily to scale. Instead, the thickness of the layers or regions may be enlarged in the drawings. Although the figures show layers and regions with clean lines and boundaries, some or all of these lines or boundaries may be idealized. In reality, the boundaries or lines may be unobservable, blended, or irregular.

Power amplifiers (PAs) are used in wireless communications to amplify signals before transmission. Due to electrical characteristics, such as power rating or maximum voltage rating, PAs are sensitive to input signal power. Accordingly, a PA can be highly sensitive to various parameters of the input signal such as the power of the signal being too high for an extended period of time. Examples described herein include power amplifier protection (PAP) circuitry that computes envelopes of input band signals, obtained before mixer circuitry of a transmission circuit, and determines a combined envelope of the band signals. In some examples, the mixer circuitry operates in parallel with the PAP circuitry to generate a radio frequency (RF) signal based on the input band signals. In this manner, information in the input band signals can be transmitted via the RF signal. The combined envelope generated by the PAP circuitry is monitored by a signal monitor to detect portions of the combined envelope indicative of corresponding portions of the RF signal that could damage a power amplifier (PA). When such an RF signal portion that could damage a PA is detected, the signal monitor sends an alarm/alert to a PAP controller. The alarm/alert triggers the PAP controller to implement a power reduction protocol to reduce power of that RF signal portion before it reaches the PA. This, in turn, prevents damage to the PA by preventing RF signals of excessive power from entering the PA.

Examples described herein can be used to accommodate different PAs. For example, a signal power threshold defining excessive power for a PA can be selected based on the electrical characteristics of that PA. The signal power threshold can be programmed into PAP circuitry based on the PA to be used in a particular circuit design.

FIG. 1 depicts a cellular communication system 102 and a satellite communication system 104 in which example power amplifier protection (PAP) circuitry 106 described herein may be implemented. Each of the cellular communication system 102 and the satellite communication system 104 includes a corresponding transceiver such as an example transceiver 108 shown in example FIG. 1. The transceiver 108 includes transmitter circuitry 112 and receiver circuitry 114. The transmitter circuitry 112 receives one or more transmit (Tx) band signal(s) (e.g., from communications logic such as a field programmable gate array (FPGA), an application-specific integrated circuit (ASIC), a baseband processor, programmable circuitry, etc. of the communication system 102, 104) and generates a Tx RF signal that includes the Tx band signals. The transmitter circuitry 112 then transmits the Tx band signals via the Tx RF signal.

The receiver circuitry 114 receives a receive (Rx) RF signal via a transmission media (e.g., an electrically conductive wire, an optical fiber, a wireless electromagnetic wave, etc.) and recovers one or more Rx band signal(s) from the Rx RF signal. The receiver circuitry 114 then provides the one or more Rx band signal(s) to communications logic of the communication system 102, 104.

In example FIG. 1, the PAP circuitry 106 is implemented in the transmitter circuitry 112. The PAP circuitry 106 protects a PA (not shown) of the transmitter circuitry 112 from damage that could be caused by portions of a Tx RF signal having too much power. For example, a signal power level that exceeds a power rating of the PA may be too much power. The cellular communication system 102 and the satellite communication system 104 may be implemented using any type of communication circuitry including 5G wireless base stations for 5G-based communication systems. Although only the cellular communication system 102 and the satellite communication system 104 are shown in FIG. 1, the PAP circuitry 106 may be implemented in any other communication systems such as automobile communication systems, mobile communication devices (e.g., mobile phones, tablet devices, laptops, etc.), desktop computers, Internet appliances, smart wearable devices, etc.

Figure 2A:
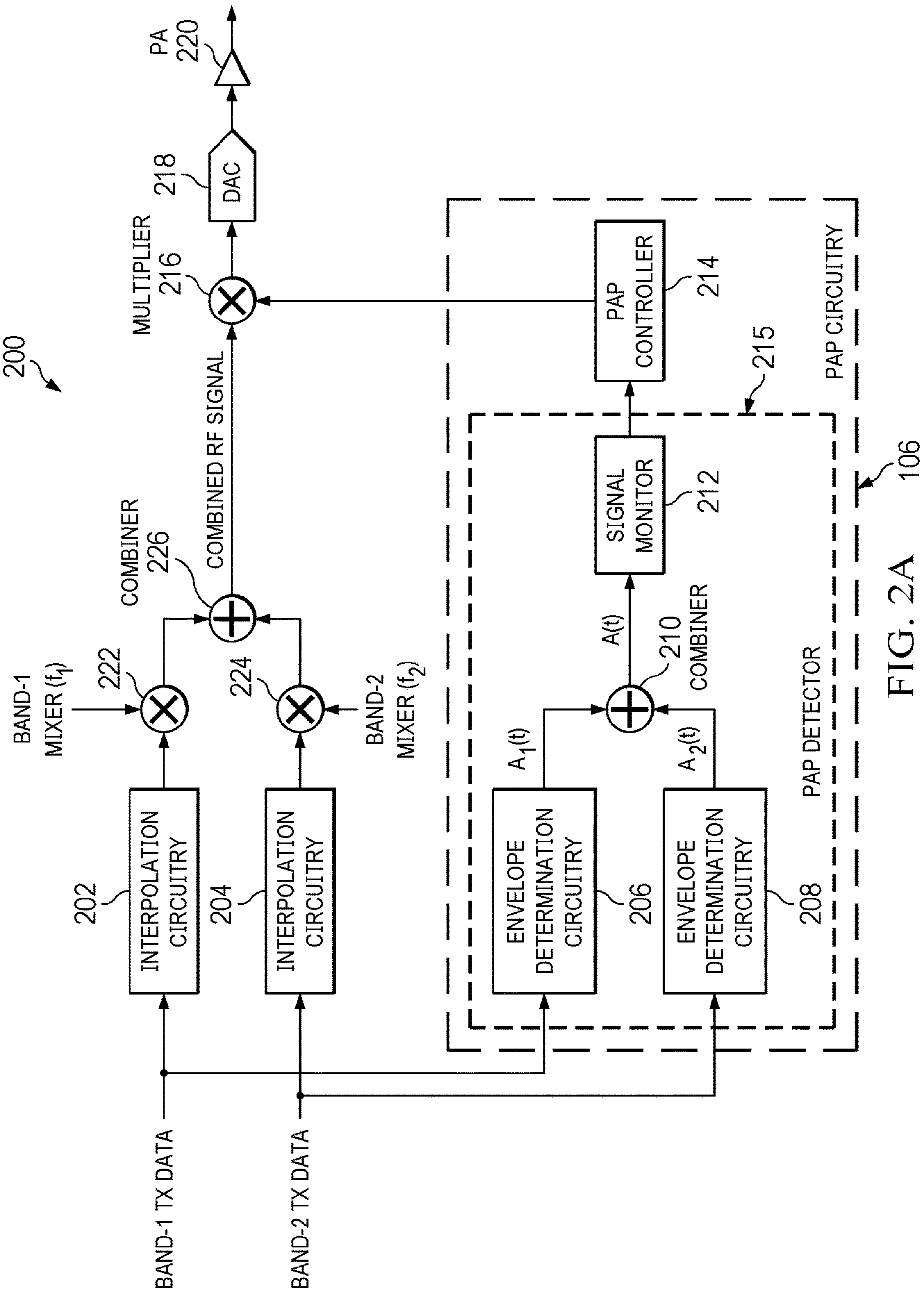
FIGS. 2A-2C illustrate example transmitter circuitry that includes the PAP circuitry of FIG. 1 to protect a power amplifier.

FIG. 2A is example transmitter circuitry 200 that includes the PAP circuitry 106 of FIG. 1. The transmitter circuitry 200 of FIG. 2A could be used to implement the transmitter circuitry 112 of FIG. 1. The transmitter circuitry 200 is implemented as a dual-band mode transmitter in which two individual input baseband signals referred to herein as band signals (e.g., "BAND-1 Tx DATA" and "BAND-2 Tx DATA") are interpolated and up-converted to radio frequency (RF) signals with different center frequencies. The example dual-band mode of the transmitter circuitry 200 allows transmitting the same data or different data on two different frequencies to support multiple band frequencies using the same device. Also or alternatively, the transmitter circuitry 200 may be implemented to process more than two band signals.

The input baseband signals are referred to as band signals to indicate that after the first and second band signals (e.g., baseband signals) are converted to RF signals, they will occupy different center frequency bands. Thus, a first band signal (e.g., a first baseband signal) occupies a first frequency band (e.g., a first center frequency), and a second band signal (e.g., a second baseband signal) occupies a second frequency band (e.g., a second center frequency) different from the first frequency band. In examples described herein, the separation between the center frequencies is small enough that the two RF signals can be combined, and a single power amplifier (PA) can be used to amplify both band signals.

In example FIG. 2A, the input band signals (e.g., "BAND-1 Tx DATA" and "BAND-2 Tx DATA") can be provided by communications logic such as an FPGA, an ASIC, a baseband processor, programmable circuitry, etc. In some examples, a baseband processor is coupled to an FPGA or an ASIC to generate the input band signals. For example, the FPGA or ASIC can encode or modulate (e.g., orthogonal frequency-division multiplexing (OFDM)) data provided by the baseband processor to generate the input band signals so that the data can be transmitted by the transmitter circuitry 200.

The transmitter circuitry 200 includes first interpolation circuitry 202, second interpolation circuitry 204, first frequency band envelope determination circuitry 206, second frequency band envelope determination circuitry 208, first combiner circuitry 210, signal monitor circuitry 212, and PAP controller circuitry 214. In example FIG. 2A, the frequency band envelope determination circuitry 206, the frequency band envelope determination circuitry 208, the combiner circuitry 210, and the signal monitor circuitry 212 are included in PAP detector circuitry 215. The PAP detector circuitry 215 and the PAP controller circuitry 214 are included in the PAP circuitry 106.

The frequency band envelope determination circuitry 206 has an input coupled to the interpolation circuitry 202. The frequency band envelope determination circuitry 206 also has an output. The frequency band envelope determination circuitry 208 has an input coupled to the interpolation circuitry 204. The frequency band envelope determination circuitry 208 also has an output. The inputs of the frequency band envelope determination circuitry 206, 208 and the interpolation circuitry 202, 204 receive input band signals. For example, the frequency band envelope determination circuitry 206 and the interpolation circuitry 202 receive a first input band signal shown in FIG. 2A as "BAND-1 Tx DATA". In addition, the frequency band envelope determination circuitry 208 and the interpolation circuitry 204 receive a second input band signal shown in FIG. 2A as “BAND-2 Tx DATA”. As used herein, a band signal is a signal that includes information and is based on a single center frequency.

In examples described herein, a band signal is up-converted by mixer circuitry (e.g., the mixer circuitry 222, 224) to a frequency used to transmit the resulting signal. However, examples described herein may also be implemented in transmission circuits that generate an intermediate frequency (IF) signal. For example, an IF signal can be generated using mixer circuitry to up-convert a band signal to an intermediate frequency that is less than an RF frequency at which signal transmission occurs. The IF signal can then be up-converted by second mixer circuitry to an RF frequency to generate an RF signal to be transmitted.

The combiner circuitry 210 has a first input coupled to the output of the frequency band envelope determination circuitry 206. The combiner circuitry 210 also has a second input coupled to the output of the frequency band envelope determination circuitry 208. The combiner circuitry 210 also has an output. The signal monitor circuitry 212 has an input coupled to the output of the combiner circuitry 210. The signal monitor circuitry 212 also has an output. The controller circuitry 214 has an input coupled to the output of the signal monitor circuitry 212.

The transmitter circuitry 200 also includes multiplier circuitry 216, digital-to-analog converter (DAC) circuitry 218, and PA circuitry 220. The multiplier circuitry 216 has a first input coupled to an output of the controller circuitry 214. The multiplier circuitry 216 also has an output. The DAC circuitry 218 has an input coupled to the output of the multiplier circuitry 216. The DAC circuitry 218 also has an output. The power amplifier circuitry 220 has an input coupled to the output of the DAC circuitry 218.

The transmitter circuitry 200 also includes first mixer circuitry 222, second mixer circuitry 224, and second combiner circuitry 226. The mixer circuitry 222 has an input coupled to an output of the interpolation circuitry 202. The mixer circuitry 222 also has an output. The mixer circuitry 224 has an input coupled to an output of the interpolation circuitry 204. The mixer circuitry 224 also has an output. The combiner circuitry 226 has a first input coupled to the output of the mixer circuitry 222 and a second input coupled to the output of the mixer circuitry 224. The combiner circuitry 226 also has an output coupled to a second input of the multiplier circuitry 216.

Figure 2B:
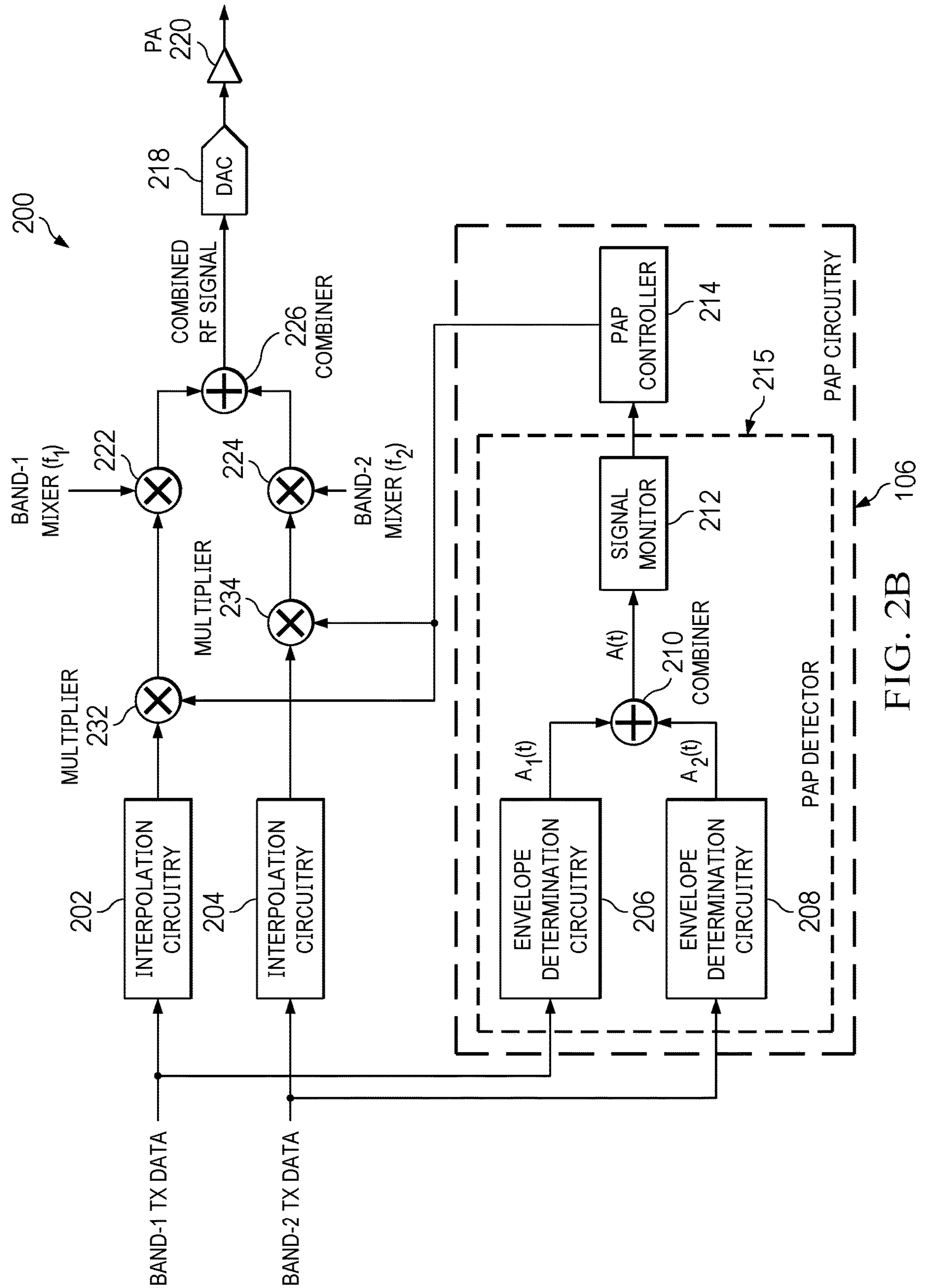

Alternatively, instead of the multiplier circuitry 216 located after the combiner circuitry 226, the multiplier circuitry 216 can be replaced by first multiplier circuitry 232 and second multiplier circuitry 234 coupled to respective outputs of the interpolation circuitry 202, 204, as shown in FIG. 2B. In example FIG. 2B, a first input of the multiplier circuitry 232 is coupled to an output of the interpolation circuitry 202 and an output of the multiplier circuitry 232 is coupled to an input of the mixer circuitry 222. In addition, a first input of the multiplier circuitry 234 is coupled to an output of the interpolation circuitry 204 and an output of the multiplier circuitry 234 is coupled to an input of the mixer circuitry 224. In such examples, the output of the PAP controller circuitry 214 is coupled to a second input of the multiplier circuitry 232 and to a second input of the multiplier circuitry 234.

Figure 2C:
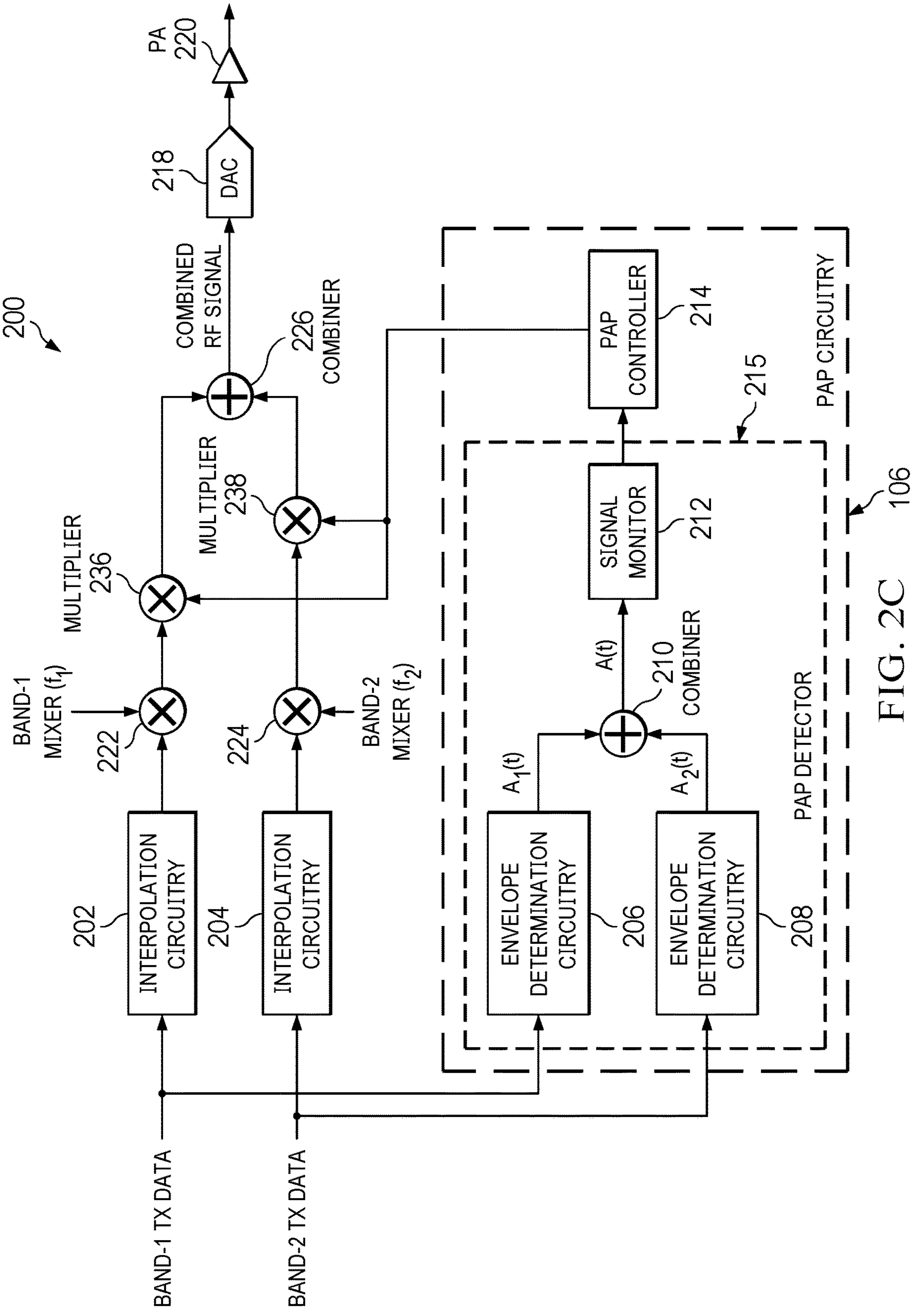

In yet another alternative implementation, the multiplier circuitry 216 can be replaced by first multiplier circuitry 236 and second multiplier circuitry 238 coupled to respective outputs of the mixer circuitry 222, 224, as shown in FIG. 2C. In example FIG. 2C, a first input of the multiplier circuitry 236 is coupled to an output of the mixer circuitry 222 and an output of the multiplier circuitry 236 is coupled to the first input of the combiner circuitry 226. In addition, a first input of the multiplier circuitry 238 is coupled to an output of the mixer circuitry 224 and an output of the multiplier circuitry 238 is coupled to the second input of the combiner circuitry 226. In such examples, the output of the PAP controller circuitry 214 is coupled to a second input of the multiplier circuitry 236 and to a second input of the multiplier circuitry 238.

In examples described herein, the input band signals (e.g., “BAND-1 Tx DATA” and “BAND-2 Tx DATA”) provided to the transmitter circuitry 200 are digital signals in a digital domain. As such, an input band signal includes digital samples that encode information carried by that band signal. To prepare the input band signals for transmission by the transmitter circuitry 200, the interpolation circuitry 202 and the interpolation circuitry 204 interpolate corresponding ones of the input band signals by generating interpolated digital samples based on original digital samples in those band signals. For example, the original digital samples in the input band signals have a sampling rate resolution such that the original digital samples occur at a particular rate over the duration of the input band signals. To increase the sampling resolutions of the input band signals, the interpolation circuitry 202, 204 use the original digital samples to generate and add interpolated digital samples between the original digital samples. As such, an example input sampling rate of the input band signals could be 500 Msps and an interpolated sampling rate of the input band signals could be 12 Gsps to match a higher sampling rate of the DAC circuitry 218.

In example FIG. 2A, a single-stage RF mixing process is performed on the interpolated band signals (e.g., higher-resolution band signals) by corresponding ones of the mixer circuitry 222 and the mixer circuitry 224 to up-convert the interpolated band signals to RF frequencies. For example, the mixer circuitry 222 mixes the interpolated band signal from the interpolation circuitry 202 with a first frequency ($f_1$) (e.g., a first center frequency ($f_1$)) and the mixer circuitry 224 mixes the interpolated band signal from the interpolation circuitry 204 with a second frequency ($f_2$) (e.g., a second center frequency ($f_2$)). In example FIG. 2A, the interpolated band signals provided by the interpolation circuitry 202, 204 are complex signals in that they include both imaginary parts and real parts of the signal. As such, the mixer circuitry 222, 224 generate the up-converted band signals as complex signals. In examples in which only one of the real or imaginary part of the complex signal is used for further processing, generation and processing logic is not needed for the one of the real or imaginary part not used for further processing. The interpolated and up-converted band signals are provided by the mixer circuitry 222, 224 to the combiner circuitry 226.

The combiner circuitry 226 generates a combined RF signal based on the interpolated and up-converted signals of the first band signal and the second band signal. The combined RF signal is a digital signal (e.g., in a digital domain) that is in final form to be provided to the DAC circuitry 218. The DAC circuitry 218 converts the combined RF signal from the digital domain to an analog combined RF signal in the analog domain. Before transmission of the analog combined RF signal, the PA circuitry 220 amplifies the power of the analog combined RF signal to a suitable level for transmission. However, some portions in one or more windows of the digital combined RF signal may have characteristics that could cause damage to the PA circuitry 220. As such, the PAP circuitry 106 monitors for such characteristics and adjusts the digital combined RF signal at any portions that could damage the PA circuitry 220 before the DAC circuitry 218 converts the digital combined RF signal to the analog combined RF signal.

Turning now to the PAP circuitry 106, the frequency band envelope determination circuitry 206, 208 determine envelopes $A_i(t)$ (e.g., frequency band envelopes) based on digital samples of corresponding ones of the input band signals (e.g., "BAND-1 Tx DATA" and "BAND-2 Tx DATA"). In examples described herein, the input band signals are complex signals that include real and imaginary parts. As such, the frequency band envelope determination circuitry 206, 208 determine the envelopes $A_i(t)$ based on the complex input band signals. If the complex signal can be represented as $x(t)=x_I(t)+jx_Q(t)$, where $x_I(t)$ and $x_Q(t)$ are the real and imaginary parts of the signal, the envelope of the signal can be computed using Equation 1 below.

$$e(t) = \sqrt{\left(x_I(t)^2 + x_Q(t)^2\right)} \quad \text{(Equation 1)}$$

For the envelopes $A_i(t)$, the index "i" is an indicator of the $i^{th}$ input band signal. For example, the frequency band envelope determination circuitry 206 determines or computes a first envelope $A_1(t)$ (e.g., index i=1) based on the first input band signal (e.g., "BAND-1 Tx DATA"), and the envelope determination circuitry 208 determines or computes a second envelope $A_2(t)$ (e.g., index i=2) based on the second input band signal (e.g., "BAND-2 Tx DATA"). The combiner circuitry 210 generates a combined envelope signal A(t) by combining the envelopes determined by the frequency band envelope determination circuitry 206, 208 based on the input band signals. For example, the combiner circuitry 210 combines the envelopes $A_1(t)$ and $A_2(t)$ according to Equation 2 below.

$$A(t) = A_1(t) + A_2(t) \quad \text{(Equation 2)}$$

The signal monitor circuitry 212 monitors the combined envelope signal A(t) generated by the combiner circuitry 210. During such monitoring, the signal monitor circuitry 212 monitors signal patterns or signal characteristics of the combined envelope signal A(t) to determine whether any portion (e.g., window) of the combined envelope signal A(t) indicates that a corresponding portion of the combined RF signal generated by the combiner circuitry 226 could damage the PA circuitry 220. In examples described herein, a determination of potential damage to the PA circuitry 220 is based on whether the combined envelope signal A(t) satisfies one or more damage criteria of the PA circuitry 220. For example, damage criteria could be established based on one or more of a power threshold, a duration threshold, a power level change rate threshold, or any other suitable characteristic of the PA circuitry 220. Characteristics of the PA circuitry 220 may be obtained from operating specifications (e.g., in a specification sheet) or design parameters of the PA circuitry 220.

For example, a power threshold may be based on an electrical power operating range of the PA circuitry 220. As such, the power threshold may be set as the maximum input operating power for which the PA circuitry 220 is rated. The duration threshold may be set as a maximum time for which the PA circuitry 220 is rated to endure a signal that satisfies (e.g., meets or exceeds) the maximum operating power of the PA circuitry 220. A power level change rate threshold may be set as an amount of change in power level per time (e.g., per microsecond, per millisecond, etc.) that the PA circuitry 220 is rated to withstand. For example, abrupt changes in power (e.g., power spikes) in a signal may cause material breakdowns in the PA circuitry 220. As such, the signal monitor circuitry 212 determines that the combined envelope signal A(t) satisfies one or more damage criteria of the PA circuitry 220 after the combined envelope signal A(t) satisfies at least one of a power threshold, a duration threshold, a power level change rate threshold, or any other operating characteristic threshold of the PA circuitry 220.

When the signal monitor circuitry 212 determines to reduce data signal power of the combined RF signal, the signal monitor circuitry 212 provides an alert or alarm to the PAP controller circuitry 214 to trigger a power-reduction protocol at the PAP controller circuitry 214. In such power-reduction protocol, the PAP controller circuitry 214 initiates a power ramp-down process to reduce data signal power of the combined RF signal. In some examples, an alarm/alert terminal from the signal monitor circuitry 212 may output a logic value of zero ('0') to represent the absence of an alarm/alert responsive to the combined envelope signal A(t) failing to satisfy one or more damage criteria (e.g., a potentially PA-damaging portion of the combined RF signal is not detected). Responsive to the combined envelope signal A(t) satisfying one or more damage criteria (e.g., a potentially PA-damaging portion of the combined RF signal is not detected), the signal monitor circuitry 212 may output a logic value of one ('1') to represent an active alarm/alert to be acted on by the PAP controller circuitry 214.

The PAP controller circuitry 214 generates one or more power reduction (PR) values in response to the alert or alarm from the signal monitor circuitry 212 indicative of a request to reduce the data signal power of the combined RF signal. For example, the PAP controller circuitry 214 generates one or more successive power reduction value(s) to gradually reduce the power in a window of the combined RF signal over time. An example format for representing such a window is T=[n:m], in which T is the window period or duration, 'n' is the start time of the potentially PA-damaging portion of the combined RF signal and 'm' is the stop time of the potentially PA-damaging portion of the combined RF signal. As used herein, a power reduction value is a value that can be used to process a signal to decrease a data signal power of that signal. For example, a power reduction value may be a multiplier value by which the signal is multiplied, may be a subtrahend to be subtracted from the signal, or may be a negative addend to be added to the signal. In FIG. 2A, a power reduction value is a multiplier value by which the multiplier circuitry 216 can multiply the combined RF signal to decrease the data signal power of the combined RF signal. For example, a power reduction value of one (PR=1) does not decrease power but instead maintains the power at its original level. However, a power reduction value of 0.9 (PR=0.9) reduces the power of the combined RF signal to 90% of its original power. Similarly, a power reduction value of 0.5 (PR=0.5) reduces the power of the combined RF signal to 50% of its original power. As such, an array of successive power reduction values generated by the PAP controller circuitry 214 may include PR[4:0]=0.9, 0.7, 0.5, 0.3, 0.1 to ramp down power gradually over time in a window. In such an example, the multiplier circuitry 216 can multiply successive portions of the combined RF signal in the window with successive power reduction values of PR[4]=0.9 at a first signal portion, PR[3]=0.7 at a second signal portion, PR[2]=0.5 at a third signal portion, PR[1]

=0.3 at a fourth signal portion, and PR[0]=0.1 at a fifth signal portion. Thereafter, the multiplier circuitry 216 can multiply the combined RF signal by zero if the affected signal portion(s) is/are to be zeroed.

In example FIG. 2B, a power reduction value is a multiplier value by which the multiplier circuitry 232, 234 can multiply the interpolated band signals from the interpolation circuitry 202, 204 to decrease the data signal power of the interpolated band signals. This, in turn, prevents a data signal power of the combined RF signal generated by the combiner circuitry 226 from damaging the PA circuitry 220. In example FIG. 2C, a power reduction value is a multiplier value by which the multiplier circuitry 236, 238 multiply the IF signals from the mixer circuitry 222, 224 to decrease the data signal power of the IF signals. This, in turn, prevents a data signal power of the combined RF signal generated by the combiner circuitry 226 from damaging the PA circuitry 220. Similar to the description above in connection with FIG. 2A, the multiplier circuitry 232, 234 of FIG. 2B and the multiplier circuitry 236, 238 of FIG. 2C may use arrays of successive power reduction values generated by the PAP controller circuitry 214 to ramp down data signal power over time in a window.

In some examples, power reduction values, such as the example values described above, are generated to ramp down power of potentially PA-damaging portions of the combined RF signal to zero out the data at those signal portions. In other examples, the power reduction values are generated to ramp down power of potentially PA-damaging portions of the combined RF signal to a power value that does not zero out the data but that takes the power level of those signal portions below the damage criterion of the PA circuitry 220. In either case, since the data at the portions of the combined RF signal that undergo power reduction may not be recoverable from those signal portions, the PAP controller circuitry 214 generates an error signal for those signal portions. The PAP controller circuitry 214 may provide that error signal as feedback to a user or communications logic (e.g., an FPGA, an ASIC, a baseband processor, etc.). In this manner, the user or communications logic can take corrective action such as modifying one or more of the input band signals to prevent damage to the PA circuitry 220 and providing the modified input band signal(s) to the transmitter circuitry 200 for re-transmission.

The portion(s) of the combined RF signal that undergo(es) power reduction correspond(s) to the portion(s) of the combined envelope signal A(t) that satisfy(ies) the damage criterion of the PA circuitry 220. Such gradual reduction of data signal power prevents subjecting the DAC circuitry 218 and the PA circuitry 220 to abrupt changes in power which could damage the DAC circuitry 218 or the PA circuitry 220. Gradual reduction in data signal power may also prevent creating an unsteady state in the DAC circuitry 218 or the PA circuitry 220 based on abrupt power changes. The number of successive power reduction values generated by the PAP controller circuitry 214 or the reduction amounts between the successive power reduction values may be based on the amount of power that needs to be reduced, the electrical operating characteristics of the DAC circuitry 218 or the PA circuitry 220, or the sensitivity of a transmission application to abrupt shifts in power. For example, if the amount of power that needs to be reduced in the combined RF signal is significant, the number of successive power reduction values may be more than if less power is to be reduced in the combined RF signal. In some examples, if the DAC circuitry 218, the PA circuitry 220, or the transmission application are more sensitive to power level changes, the reduction amounts between the successive power reduction values may be smaller than if the DAC circuitry 218, the PA circuitry 220, or the transmission application are less sensitive to power level changes.

In FIG. 2A, during the power reduction process performed by the PAP controller circuitry 214 and the multiplier circuitry 216, the signal monitor circuitry 212 continues to monitor other portions of the incoming combined envelope signal A(t) to determine whether such portions of the combined envelope signal A(t) satisfy the one or more damage criteria. In this manner, the signal monitor circuitry 212 can determine whether to continue reducing data signal power in subsequent portions the combined RF signal or to stop reducing power. When the signal monitor circuitry 212 determines to stop power reduction of the combined RF signal, the signal monitor circuitry 212 stops providing the alert or alarm to the PAP controller circuitry 214. Also or alternatively, any suitable external signal separate from the signal monitor circuitry 212 can be provided to remove the alert or alarm to start the ramp-up of the signal power. In any case, the absence of the alert or alarm indicates that the PAP controller circuitry 214 is to initiate a power ramp-up protocol of the combined RF signal. In this manner, subsequent portions of the combined RF signal are propagated through the multiplier circuitry 216 and to the DAC circuitry 218 and the PA circuitry 220 at their original power levels.

In FIG. 2A, during the power ramp-up process, the PAP controller circuitry 214 provides the successive power reduction values previously generated by the PAP controller circuitry 214 (e.g., PR[4:0]=0.9, 0.7, 0.5, 0.3, 0.1) in reverse order (e.g., PR[4:0]=0.1, 0.3, 0.5, 0.7, 0.9) to the multiplier circuitry 216. The multiplier circuitry 216 ramps up the data signal power of the combined RF signal by multiplying subsequent portions of the combined RF signal with the successive power reduction values in reverse order to gradually ramp up the power of the combined RF signal over time. For example, the multiplier circuitry 216 can multiply successive portions of the combined RF signal with reverse successive power reduction values of PR[4]=0.1 at a first signal portion, PR[3]=0.3 at a second signal portion, PR[2]=0.5 at a third signal portion, PR[1]=0.7 at a fourth signal portion, and PR[0]=0.9 at a fifth signal portion. Thereafter, the multiplier circuitry 216 applies a multiplier value of one (e.g., PR=1) to the combined RF signal to maintain the original power of subsequent portions of the combined RF signal without any power reduction. Similar to decreasing data signal power, gradually increasing data signal power in this manner prevents subjecting the DAC circuitry 218, the PA circuitry 220, or the transmission application to abrupt changes in power which could damage the DAC circuitry 218 or the PA circuitry 220. In some examples, such gradual increase in power also prevents creating an unsteady state in the DAC circuitry 218 or the PA circuitry 220 based on abrupt power changes.

Turning briefly to FIG. 2B, during a power reduction process performed by the PAP controller circuitry 214 and the multiplier circuitry 232, 234 for the interpolated band signals from the interpolation circuitry 202, 204, the signal monitor circuitry 212 continues to monitor other portions of the incoming combined envelope signal A(t) to determine whether such portions of the combined envelope signal A(t) satisfy the one or more damage criteria. In this manner, the signal monitor circuitry 212 can determine whether to continue reducing data signal power in subsequent portions of the interpolated band signals or to stop reducing power. When the signal monitor circuitry 212 determines to stop power reduction of the interpolated band signals, the signal monitor circuitry 212 stops providing the alert or alarm to the PAP controller circuitry 214. Also or alternatively, any suitable external signal separate from the signal monitor circuitry 212 can be provided to remove the alert or alarm to start the ramp-up of the signal power. In any case, the absence of the alert or alarm indicates that the PAP controller circuitry 214 is to initiate a power ramp-up protocol of the interpolated band signals. In this manner, subsequent portions of the interpolated band signals are propagated to the mixer circuitry 222, 224 at their original power levels.

In FIG. 2B, during the power ramp-up process, the PAP controller circuitry 214 provides the successive power reduction values previously generated by the PAP controller circuitry 214 (e.g., PR[4:0]=0.9, 0.7, 0.5, 0.3, 0.1) in reverse order (e.g., PR[4:0]=0.1, 0.3, 0.5, 0.7, 0.9) to the multiplier circuitry 232, 234. The multiplier circuitry 232, 234 ramps up the data signal power of the interpolated band signals by multiplying subsequent portions of the interpolated band signals with the successive power reduction values in reverse order to gradually ramp up the power of the interpolated band signals over time. For example, the multiplier circuitry 232, 234 can multiply successive portions of the interpolated band signals with reverse successive power reduction values of PR[4]=0.1 at first signal portions, PR[3]=0.3 at second signal portions, PR[2]=0.5 at third signal portions, PR[1]=0.7 at fourth signal portions, and PR[0]=0.9 at fifth signal portions. Thereafter, the multiplier circuitry 232, 234 apply a multiplier value of one (e.g., PR=1) to corresponding ones of the interpolated band signals to maintain the original power of subsequent portions of the interpolated band signals without power reduction.

Turning briefly to FIG. 2C, during a power reduction process performed by the PAP controller circuitry 214 and the multiplier circuitry 236, 238 for the up-converted band signals from the mixer circuitry 222, 224, the signal monitor circuitry 212 continues to monitor other portions of the incoming combined envelope signal A(t) to determine whether such portions of the combined envelope signal A(t) satisfy the one or more damage criteria. In this manner, the signal monitor circuitry 212 can determine whether to continue reducing data signal power in subsequent portions of the up-converted band signals or to stop reducing power. When the signal monitor circuitry 212 determines to stop power reduction of the up-converted band signals, the signal monitor circuitry 212 stops providing the alert or alarm to the PAP controller circuitry 214. Also or alternatively, any suitable external signal separate from the signal monitor circuitry 212 can be provided to remove the alert or alarm to start the ramp-up of the signal power. In any case, the absence of the alert or alarm indicates that the PAP controller circuitry 214 is to initiate a power ramp-up protocol of the up-converted band signals. In this manner, subsequent portions of the up-converted band signals are propagated to the combiner circuitry 226 at their original power levels.

In FIG. 2C, during the power ramp-up process, the PAP controller circuitry 214 provides the successive power reduction values previously generated by the PAP controller circuitry 214 (e.g., PR[4:0]=0.9, 0.7, 0.5, 0.3, 0.1) in reverse order (e.g., PR[4:0]=0.1, 0.3, 0.5, 0.7, 0.9) to the multiplier circuitry 236, 238. The multiplier circuitry 236, 238 ramps up the data signal power of the up-converted band signals by multiplying subsequent portions of the up-converted band signals with the successive power reduction values in reverse order to gradually ramp up the power of the up-converted band signals over time. For example, the multiplier circuitry 236, 238 can multiply successive portions of the up-converted band signals with reverse successive power reduction values of PR[4]=0.1 at first signal portions, PR[3]=0.3 at second signal portions, PR[2]=0.5 at third signal portions, PR[1]=0.7 at fourth signal portions, and PR[0]=0.9 at fifth signal portions. Thereafter, the multiplier circuitry 236, 238 apply a multiplier value of one (e.g., PR=1) to corresponding ones of the up-converted band signals to maintain the original power of subsequent portions of the up-converted band signals without power reduction.

Returning to example FIG. 2A, the input of the frequency band envelope determination circuitry 206 is coupled to an input of the interpolation circuitry 202, and the input of the frequency band envelope determination circuitry 208 is coupled to an input of the interpolation circuitry 204. However, in other examples, the input of the frequency band envelope determination circuitry 206 and the input of the frequency band envelope determination circuitry 208 may be coupled to any other suitable points between the inputs and outputs of corresponding ones of the interpolation circuitry 202 and the interpolation circuitry 204. Example alternative connection configurations are shown by way of example in FIGS. 3 and 4.

Figure 3:
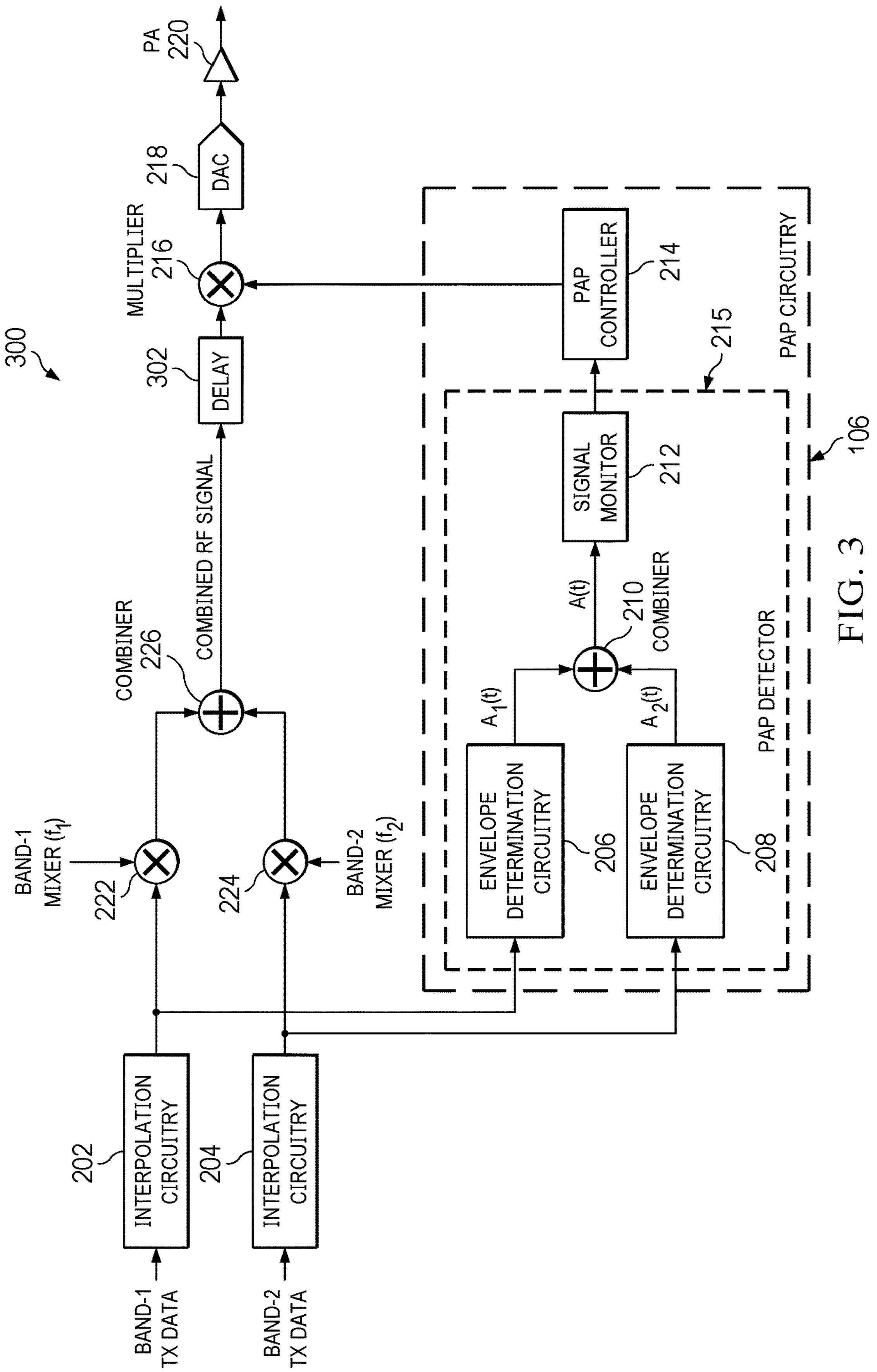
FIG. 3 is example transmitter circuitry that includes another implementation of the PAP circuitry of FIG. 1 in which inputs of frequency band envelope determination circuitry are connected to outputs of interpolation circuitry.
Figure 4:
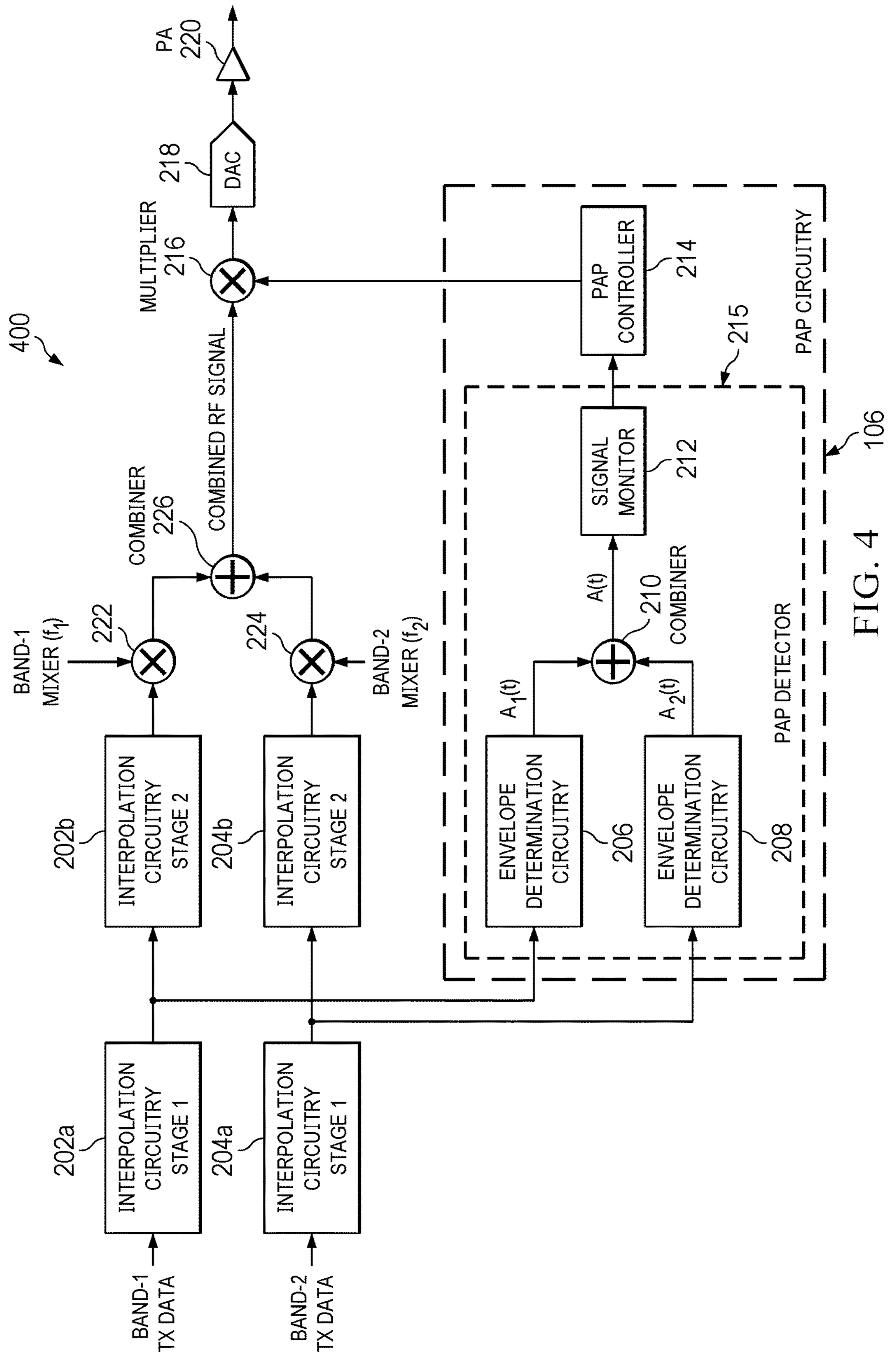
FIG. 4 is example transmitter circuitry that includes yet another implementation of the PAP circuitry of FIG. 1 in which inputs of frequency band envelope determination circuitry are coupled to interpolation circuitry between interpolation circuitry stages.

FIG. 3 is example transmitter circuitry 300 that includes another implementation of the PAP circuitry 106 of FIG. 1. In example FIG. 3, the input of the frequency band envelope determination circuitry 206 is coupled to an output of the interpolation circuitry 202, and the input of the frequency band envelope determination circuitry 208 is coupled to an output of the interpolation circuitry 204. FIG. 4 is example transmitter circuitry 400 that includes yet another implementation of the PAP circuitry 106 of FIG. 1. In example FIG. 4, the input of the frequency band envelope determination circuitry 206 is coupled to an output of first interpolation circuitry stage 1 202*a* (e.g., a first stage of the interpolation circuitry 202) and an input of first interpolation circuitry stage 2 202*b* (e.g., a second stage of the interpolation circuitry 202). Also in FIG. 4, the input of the frequency band envelope determination circuitry 208 is coupled to an output of second interpolation circuitry stage 1 204*a* (e.g., a first stage of the interpolation circuitry 204) and an input of second interpolation circuitry stage 2 204*b* (e.g., a second stage of the interpolation circuitry 204).

Selecting where to couple the inputs of the frequency band envelope determination circuitry 206, 208 relative to the inputs and outputs of the interpolation circuitry 202, 204 allows providing different numbers of digital samples to the frequency band envelope determination circuitry 206, 208. For example, since the interpolation circuitry 202, 204 generates (e.g., interpolates) interpolated digital samples based on digital samples of input band signals, coupling the inputs of the frequency band envelope determination circuitry 206, 208 to inputs of the interpolation circuitry 202, 204, as shown in FIG. 2A, results in providing only the original samples of the input band signals to the frequency band envelope determination circuitry 206, 208. In addition, such configurations allow the interpolation circuitry 202, 204 to generate interpolated digital samples for the input band signals in parallel with the frequency band envelope determination circuitry 206, 208 determining the envelopes of the original digital samples of the input band signals. An advantage of this parallel configuration is that digital logic area is reduced by not needing to add delay logic to the transmitter circuitry 200 of FIG. 2A to account for the interpolation circuitry 202, 204 and the frequency band envelope determination circuitry 206, 208 processing same portions of signals at different times. Another advantage of the parallel configuration includes reducing digital dynamic power by not needing to power additional delay logic. Yet another advantage of the parallel configuration is that the frequency band envelope determination circuitry 206, 208 processes the input band signals at their original sample frequency rather than a higher sample frequency at outputs of the interpolation circuitry 202, 204. This allows a reduction in power by not needing to run higher clock frequencies for higher sampling rates in the transmitter circuitry 200 of FIG. 2A to process higher-resolution versions of the input band signals that are generated by the interpolation circuitry 202, 204.

Coupling the inputs of the frequency band envelope determination circuitry 206, 208 to outputs of the interpolation circuitry 202, 204, as shown in FIG. 3, results in providing the original samples and the interpolated samples of the input band signals (e.g., all the interpolated samples generated by the interpolation circuitry 202, 204) to the frequency band envelope determination circuitry 206, 208. Coupling the inputs of the frequency band envelope determination circuitry 206, 208 to inputs and outputs of successive stages of the interpolation circuitry 202, 204, as shown in FIG. 4, results in providing the original samples and some interpolated samples of the input band signals (e.g., less than all the interpolated samples generated by the interpolation circuitry 202, 204) to the frequency band envelope determination circuitry 206, 208.

Coupling the inputs of the frequency band envelope determination circuitry 206, 208 to the inputs of the interpolation circuitry 202, 204, as shown in FIG. 2A, allows reducing a digital logic semiconductor area and digital dynamic power used to implement the frequency band envelope determination circuitry 206, 208. For example, by providing fewer samples (e.g., the original samples) of the input band signals (e.g., a low-resolution representation of the input band signals) to the frequency band envelope determination circuitry 206, 208, the PAP circuitry 106 can operate at a lower sampling rate. Using a lower sampling rate reduces the complexity and amount of circuitry of the PAP circuitry 106. This reduces the digital logic area used to fabricate the transmitter circuitry 200 and, in turn, reduces digital dynamic power used by the transmitter circuitry 200. In addition, operating the PAP circuitry 106 at a lower sampling rate further reduces the digital dynamic power consumed by the PAP circuitry 106 relative to running at higher sampling rates. Coupling the inputs of the frequency band envelope determination circuitry 206, 208 to the inputs of the interpolation circuitry 202, 204, such as in FIG. 2A, also allows the frequency band envelope determination circuitry 206, 208 to operate in parallel on the same portions of the input band signals that are being processed by the interpolation circuitry 202, 204.

In alternative implementations in which the inputs of the frequency band envelope determination circuitry 206, 208 are coupled to the outputs of the interpolation circuitry 202, 204, delay circuitry 302 may be added to the transmitter circuitry 200 between the combiner circuitry 226 and the multiplier circuitry 216. Such delay circuitry prevents portions of the combined RF signal from reaching the multiplier circuitry 216 before the PAP circuitry 106 can process and monitor envelopes corresponding to those portions. As such, one advantage of coupling the inputs of the frequency band envelope determination circuitry 206, 208 to the inputs of the interpolation circuitry 202, 204 includes parallel processing of the frequency band envelope determination circuitry 206, 208 and the interpolation circuitry 202, 204. Another advantage includes reducing digital logic area by not needing to add delay logic to the transmitter circuitry 200. Yet another advantage includes reducing digital dynamic power by not powering the additional delay logic and by not needing to run higher clock frequencies for higher sampling rates to process higher-resolution versions of the input band signals that are generated by the interpolation circuitry 202, 204.

Moving the inputs of the frequency band envelope determination circuitry 206, 208 to the outputs of the interpolation circuitry 202, 204 to adjust the number of digital samples for each input band signal available to the frequency band envelope determination circuitry 206, 208 allows tuning the performance of the frequency band envelope determination circuitry 206, 208. For example, more digital samples for the input band signals per unit of time create a higher resolution representation (e.g., a higher resolution in time) of the input band signals. For example, adding additional digital samples in a time period of a signal produces a representation of the signal in that time period that has a higher sample resolution relative to a sample resolution before the additional digital samples were added. This can improve an accuracy performance of the frequency band envelope determination circuitry 206, 208 because the frequency band envelope determination circuitry 206, 208 can determine a more accurate representation of envelopes based on the higher resolution of samples.

However, as described above, a trade-off of this higher resolution of samples is that the frequency band envelope determination circuitry 206, 208 has to run at a higher sampling rate to detect the higher number of digital samples. Running at a higher sampling rate, in turn, consumes higher power and may require higher cost circuitry to implement the frequency band envelope determination circuitry 206, 208 or to implement other portions of the transmitter circuitry 200. As such, the flexibility of selecting different coupling points of the inputs of the frequency band envelope determination circuitry 206, 208 to the interpolation circuitry 202, 204, as shown in FIGS. 2-4, allows tuning trade-offs between frequency envelope accuracies, sampling rates, digital logic area, and digital dynamic power of the transmitter circuitry 200.

Although the transmitter circuitry 200, 300, 400 of FIGS. 2-4 are shown receiving two input band signals (e.g., "BAND-1 Tx DATA" and "BAND-2 Tx DATA"), examples described herein are readily scalable to be implemented with any number of input band signals. Accordingly, the transmitter circuitry 200, 300, 400 may be scaled up with relatively little or no impact to signal propagation timing by adding additional circuitry in parallel with the circuitry shown in FIGS. 2-4. For example, the transmitter circuitry 200, 300, 400 may be scaled up by including one or more interpolation circuits (e.g., substantially similar or identical to the interpolation circuitry 202, 204), one or more mixer circuits (e.g., substantially similar or identical to the mixer circuitry 222, 224), and one or more frequency band envelope determination circuits (e.g., substantially similar or identical to the frequency band envelope determination circuitry 206, 208). In such examples, third frequency band envelope determination circuitry has an input coupled to third interpolation circuitry to receive a third band signal (e.g., "BAND-3 Tx DATA"). The third frequency band envelope determination circuitry also has an output coupled to a third input of the combiner circuitry 210 and determines an envelope of the third band signal. The combiner circuitry 210 generates the combined envelope signal by combining the envelopes of the first, second, and third band signals.

To generate the combined RF signal based on the first, second, and third band signals, third mixer circuitry (e.g., substantially similar or identical to the mixer circuitry 222, 224) has an input coupled to an output of the third interpolation circuitry to receive an interpolated band signal and generate a third interpolated and up-converted band signal. An output of the third mixer circuitry is connected to the input of the combiner circuitry 226 so that the combiner circuitry 226 can generate the combined RF signal based on the interpolated and up-converted band signals from the mixer circuitry 222, the mixer circuitry 224, and the third mixer circuitry.

Figure 5:
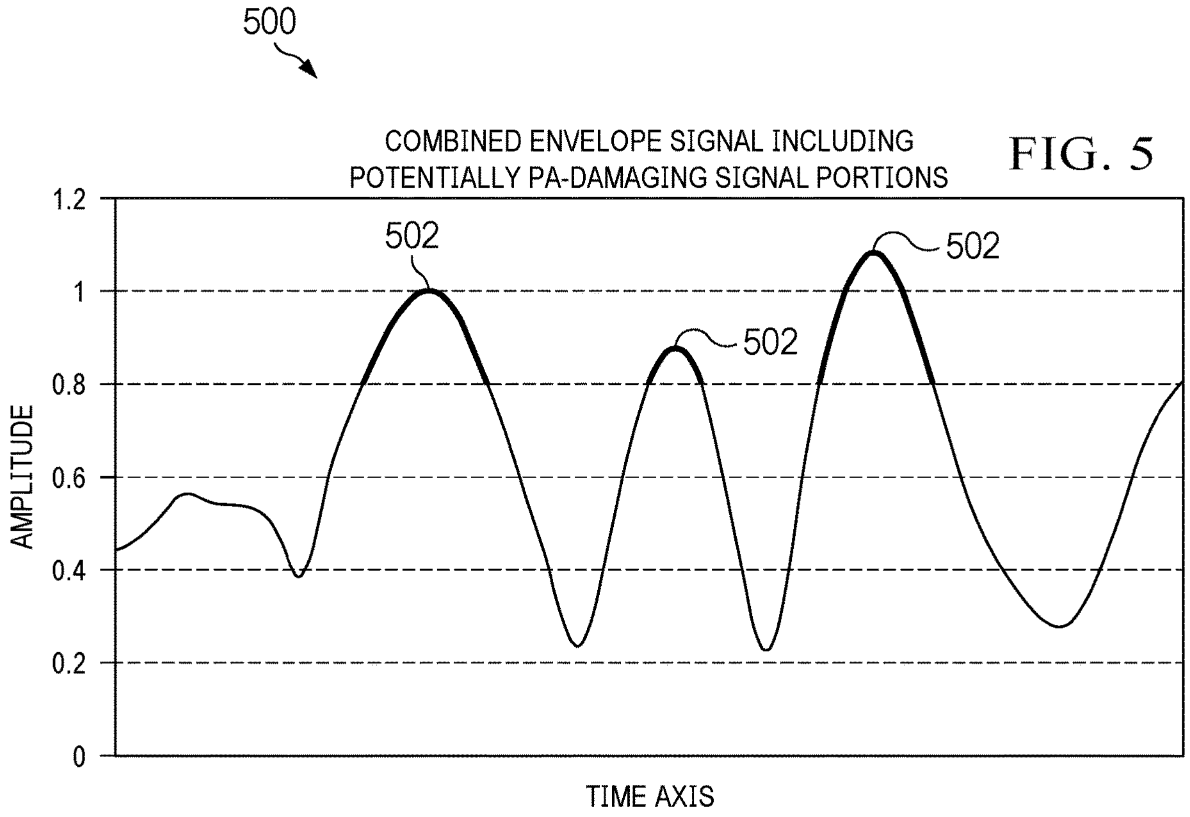
FIG. 5 is an example signal plot showing damage-candidate portions detected by the PAP circuitry of FIGS. 1-4 in a frequency band envelope.

FIG. 5 is an example signal plot showing damage-candidate portions detected by the PAP circuitry 106 (FIGS. 1-4) in an envelope 500 of an input signal (e.g., the "BAND-1 Tx DATA" or the "BAND-2 Tx DATA"). In examples described herein, a damage-candidate portion of the envelope 500 corresponds to a portion of the combined RF signal that could damage the PA circuitry 220 (FIGS. 2-4). In FIG. 5, example damage-candidate portions 502 of the envelope 500 are shown as satisfying (e.g., exceeding) a power threshold. In example FIG. 5, the power threshold is shown at an amplitude value of 0.8 which could correspond to an electrical power value. When the signal monitor circuitry 212 (FIGS. 2-4) detects the damage-candidate portions 502, the signal monitor circuitry 212 generates an alert or alarm for the PAP controller circuitry 214 (FIGS. 2-4) to reduce data signal power for corresponding portions of the combined RF signal. However, other portions of the envelope 500 that are not candidates for causing damage to the PA circuitry 220 do not satisfy the power threshold. As such, the signal monitor circuitry 212 stops issuing the alert or alarm to the PAP controller circuitry 214 for such non-damage-candidate portions of the combined RF signal. Although the damage-candidate portions 502 are based on a power threshold, other damage-candidate portions could be detected by the signal monitor circuitry 212 based on one or more other damage criteria instead of or in addition to the power threshold.

Figure 6:
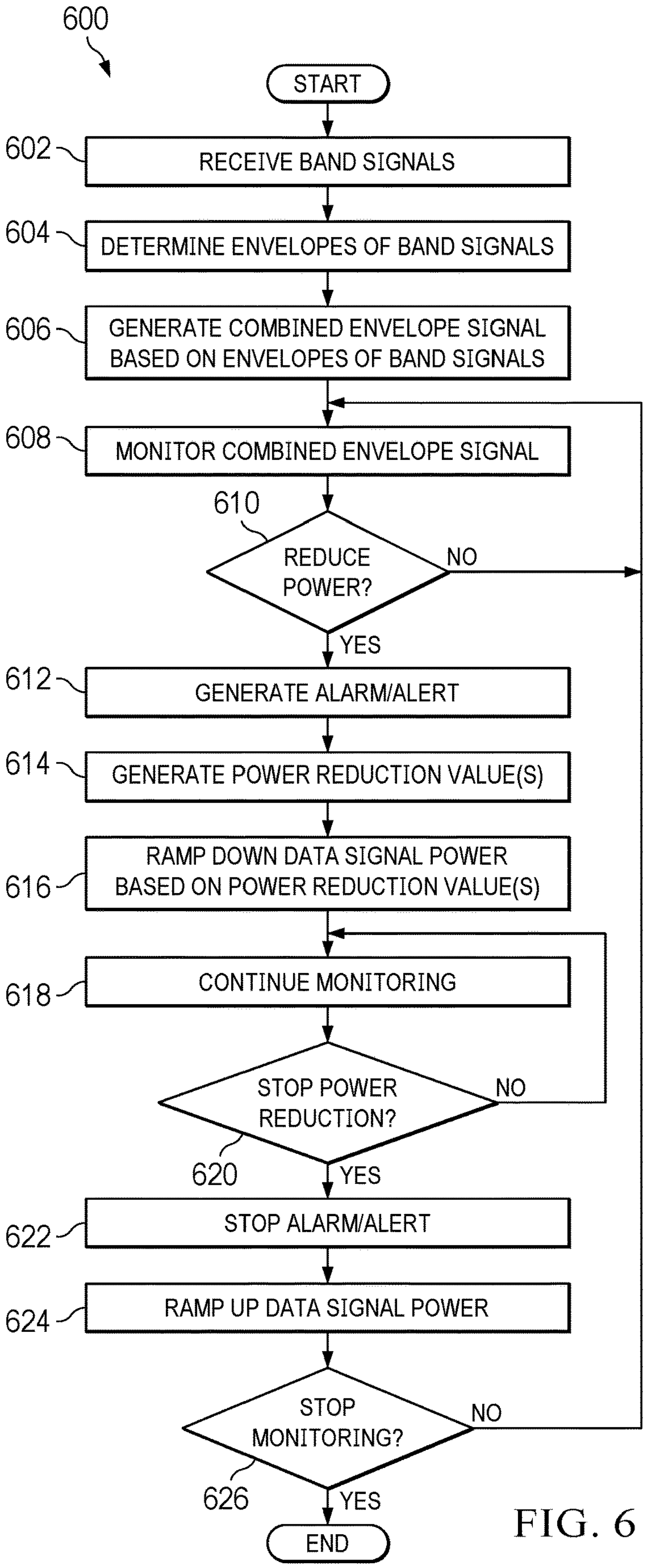
FIG. 6 is a flowchart of example operations to implement the PAP circuitry of FIGS. 1-4 to protect a power amplifier from damage by portions of combined RF signals that exceed a power threshold.

FIG. 6 is a flowchart of example operations 600 to implement the PAP circuitry 106 of FIGS. 1-4 to protect a power amplifier (e.g., the power amplifier circuitry 220 of FIGS. 2-4) from damage by portions of combined RF signals that exceed a power threshold. The flowchart of FIG. 6 represents a sequence of operations performed by the PA circuitry 106 on a particular window of the input band signals. As the input band signals continue streaming into the transmitter circuitry 200, 300, 400, the operations of FIG. 6 are performed by the PAP circuitry 106 in parallel to continuously monitor subsequent incoming windows of the input band signals.

The operations of FIG. 6 begin at block 602 at which the frequency band envelope determination circuitry 206, 208 receive input band signals. The frequency band envelope determination circuitry 206, 208 determine envelopes of the input band signals (block 604). The combiner circuitry 210 generates a combined envelope signal by combining the envelopes of the band signals (block 606).

The signal monitor circuitry 212 monitors the combined envelope signal (block 608). The signal monitor circuitry 212 determines whether to reduce power of a combined RF signal corresponding to the combined envelope signal (block 610). For example, if the signal monitor circuitry 212 determines that a window of the combined envelope signal satisfies a damage criterion of the PA circuitry 220 (e.g., the corresponding combined RF signal could damage the PA circuitry 220) (block 610: YES), the signal monitor circuitry 212 issues an alarm/alert to the PAP controller circuitry 214 to reduce power of one or more corresponding portions of the combined RF signal (block 612). In such instance, the PAP controller circuitry 214 generates one or more power reduction values (block 614). For example, in response to the alarm/alert, the PAP controller circuitry 214 implements a power reduction protocol by generating one or more successive power reduction value(s) to gradually reduce the power of a portion of the combined RF signal over time. The portions of the combined RF signal that undergo this power reduction correspond to the window of the combined envelope signal that satisfies the damage criterion of the PA circuitry 220.

The multiplier circuitry 216 ramps down the data signal power of the combined RF signal based on the one or more power reduction values (block 616). For example, the multiplier circuitry 216 may apply the one or more power reduction value(s) of block 614 to portions of the combined RF signal to gradually ramp down the power of the combined RF signal. To do this, the multiplier circuitry 216 multiplies successive portions of the combined RF signal with successive ones of the power reduction values. The signal monitor circuitry 212 continues monitoring combined envelope signals provided by the combiner circuitry 210 (block 618).

The signal monitor circuitry 212 determines whether to stop power reduction of the combined RF signal (block 620). If the signal monitor circuitry 212 determines to stop power reduction of the combined RF signal (block 620: YES), the signal monitor circuitry 212 stops issuing the alarm/alert to the PAP controller circuitry 214 (block 622). The multiplier circuitry 216 ramps up data signal power of the combined RF signal (block 624). For example, the PAP controller circuitry 214 provides the one or more power reduction value(s) of block 614 in reverse order to the multiplier circuitry 216. The multiplier then applies the one or more power reduction value(s) of block 614 in reverse order to the combined RF signal. For example, the multiplier circuitry 216 multiplies successive portions of the combined RF signal by increasing ones of the power reduction values to gradually ramp up the power of the combined RF signal over time.

The signal monitor circuitry 212 determines whether to stop monitoring envelopes from the frequency band envelope determination circuitry 206, 208 (block 626). For example, the signal monitor circuitry 212 may determine to stop monitoring when an input signal is absent. Also or alternatively, the signal monitor circuitry 212 may determine to stop monitoring in response to an external signal enabling or disabling monitoring activities of the signal monitor circuitry 212. Such external signal could be provided by a controller, a processor, or from any other suitable circuitry (e.g., communications logic such as an FPGA, an ASIC, a baseband processor, programmable circuitry, etc.). If the signal monitor circuitry 212 determines to not stop monitoring (block 626: NO), control returns to block 608. However, if the signal monitor circuitry 212 determines to stop monitoring (block 626: YES), the operations 600 of FIG. 6 end.

From the foregoing, it will be appreciated that example systems, apparatus, articles of manufacture, and methods have been described that protect power amplifiers. Described systems, apparatus, articles of manufacture, and methods improve the operation of transmitter circuits by reducing or eliminating the likelihood of damage to power amplifiers by data signal power levels. Described systems, apparatus, articles of manufacture, and methods are accordingly directed to one or more improvement(s) in the operation of a machine such as a computer or other electronic or mechanical device.

Descriptors "first," "second," "third," etc. are used herein when identifying multiple elements or components which may be referred to separately. Unless otherwise specified or implied based on their context of use, such descriptors do not impute any meaning of priority, physical order, or arrangement in a list, or ordering in time but are merely used as labels for referring to multiple elements or components separately for ease of understanding the described examples. In some examples, the descriptor "first" may be used to refer to an element in the detailed description, while the same element may be referred to in a claim with a different descriptor such as "second" or "third." In such instances, such descriptors are used merely for ease of referencing multiple elements or components.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other.

In the description and in the claims, the terms "including" and "having" and variants thereof are to be inclusive in a manner similar to the term "comprising" unless otherwise noted. Unless otherwise stated, "about," "approximately," or "substantially" preceding a value means+/−10 percent of the stated value. In another example, "about," "approximately," or "substantially" preceding a value means+/−5 percent of the stated value. In another example, "about," "approximately," or "substantially" preceding a value means+/−1 percent of the stated value.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, "programmable circuitry" is defined to include (i) one or more special purpose electrical circuits (e.g., an application specific integrated circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface (s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple", "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple", "coupled", "couples", or variants thereof, include an indirect or direct electrical or mechanical connection.

Although not all separately labeled in the figures, components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects. As used herein, the terms "terminal," "node," "interconnection," "pin," "pad," and "lead" are used interchangeably. Unless specifically stated to the contrary, these terms are generally used to mean an interconnection between or a terminus of a device element, a circuit element, an integrated circuit, a device or other electronics or semiconductor component.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an integrated circuit (IC) or a printed circuit board (PCB) may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes.

A circuit or device that is described herein as including certain components may instead be adapted to be coupled to those components to be included in the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to be included in the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent. Modifications are possible in the described examples, and other examples are possible, within the scope of the claims.

What is claimed is:

1. An apparatus comprising:

first interpolation circuitry;

second interpolation circuitry;

first frequency band envelope determination circuitry having an input coupled to the first interpolation circuitry, and having an output;

second frequency band envelope determination circuitry having an input coupled to the second interpolation circuitry, and having an output;

combiner circuitry having a first input coupled to the output of the first frequency band envelope determination circuitry, having a second input coupled to the output of the second frequency band envelope determination circuitry, and having an output; and signal monitor circuitry having an input coupled to the output of the combiner circuitry.

2. The apparatus of claim 1, including;

controller circuitry having an input coupled to an output of the signal monitor circuitry, and having an output;

multiplier circuitry having a first input coupled to the output of the controller circuitry, and having an output;

digital-to-analog converter circuitry having an input coupled to the output of the multiplier circuitry, and having an output; and power amplifier circuitry having an input coupled to the output of the digital-to-analog converter circuitry.

3. The apparatus of claim 2, including:

first mixer circuitry having an input coupled to the first interpolation circuitry, and having an output;

second mixer circuitry having an input coupled to the second interpolation circuitry, and having an output; and second combiner circuitry having a first input coupled to the output of the first mixer circuitry, having a second input coupled to the output of the second mixer circuitry, and having an output coupled to a second input of the multiplier circuitry.

4. The apparatus of claim 1, wherein:

the input of the first frequency band envelope determination circuitry is coupled to an input of the first interpolation circuitry, and the input of the second frequency band envelope determination circuitry is coupled to an input of the second interpolation circuitry.

5. The apparatus of claim 1, wherein:

the input of the first frequency band envelope determination circuitry is coupled to an output of the first interpolation circuitry; and the input of the second frequency band envelope determination circuitry is coupled to an output of the second interpolation circuitry.

6. The apparatus of claim 1, wherein the input of the first frequency band envelope determination circuitry is coupled to an output of a first stage of the first interpolation circuitry and an input of a second stage of the first interpolation circuitry.

7. The apparatus of claim 1, including:

controller circuitry having an input coupled to an output of the signal monitor circuitry, and having an output;

first multiplier circuitry having a first input coupled to the first interpolation circuitry and having a second input coupled to the output of the controller circuitry, and having an output;

second multiplier circuitry having a first input coupled to the second interpolation circuitry and having a second input coupled to the output of the controller circuitry, and having an output;

first mixer circuitry having an input coupled to the output of the first multiplier circuitry;

second mixer circuitry having an input coupled to the output of the second multiplier circuitry; and second combiner circuitry having a first input coupled to the output of the first mixer circuitry, having a second input coupled to the output of the second mixer circuitry.

8. The apparatus of claim 1, including:

controller circuitry having an input coupled to an output of the signal monitor circuitry, and having an output;

first mixer circuitry having an input coupled to the first interpolation circuitry, and having an output;

second mixer circuitry having an input coupled to the second interpolation circuitry, and having an output;

first multiplier circuitry having a first input coupled to the output of the first mixer circuitry and having a second input coupled to the output of the controller circuitry, and having an output;

second multiplier circuitry having a first input coupled to the output of the second mixer circuitry and having a second input coupled to the output of the controller circuitry, and having an output; and second combiner circuitry having a first input coupled to the output of the first multiplier circuitry and having a second input coupled to the output of the second multiplier circuitry.

9. An apparatus comprising:

power amplifier circuitry having an input;

digital-to-analog converter circuitry having an output coupled to the input of the power amplifier circuitry, and having an input;

multiplier circuitry having an output coupled to the input of the digital-to-analog converter circuitry, and having a first input and a second input;

first combiner circuitry having an output coupled to the first input of the multiplier circuitry, and having a first input and a second input;

first mixer circuitry having an output coupled to the first input of the first combiner circuitry, and having an input;

second mixer circuitry having an output coupled to the second input of the first combiner circuitry, and having an input;

first interpolation circuitry having an output coupled to the input of the first mixer circuitry, and having an input;

second interpolation circuitry having an output coupled to the input of the second mixer circuitry, and having an input;

first frequency band envelope determination circuitry having an input coupled to the first interpolation circuitry, and having an output;

second frequency band envelope determination circuitry having an input coupled to the second interpolation circuitry, and having an output;

second combiner circuitry having a first input coupled to the output of the first frequency band envelope determination circuitry and a second input coupled to the output of the second frequency band envelope determination circuitry, and having an output; and signal monitor circuitry having an input coupled to the output of the second combiner circuitry.

10. The apparatus of claim 9, wherein:

the input of the first frequency band envelope determination circuitry is coupled to an input of the first interpolation circuitry, and the input of the second frequency band envelope determination circuitry is coupled to an input of the second interpolation circuitry.

11. The apparatus of claim 9, wherein:

the input of the first frequency band envelope determination circuitry is coupled to an output of the first interpolation circuitry; and the input of the second frequency band envelope determination circuitry is coupled to an output of the second interpolation circuitry.

12. The apparatus of claim 9, wherein the input of the first frequency band envelope determination circuitry is coupled to an output of a first stage of the first interpolation circuitry and an input of a second stage of the first interpolation circuitry.

13. The apparatus of claim 9, including controller circuitry having an input coupled to an output of the signal monitor circuitry, and having an output coupled to the second input of the multiplier circuitry.

14. An apparatus comprising:

frequency band envelope determination circuitry configured to determine an envelope corresponding to a first band signal, and having an output;

combiner circuitry having an input coupled to the output of the frequency band envelope determination circuitry and configured to generate a combined envelope signal by combining the envelope corresponding to the first band signal with an envelope corresponding to a second band signal, and having an output;

signal monitor circuitry configured to determine that the combined envelope signal satisfies a damage criterion of a power amplifier, and having an output;

controller circuitry having an input coupled to the output of the signal monitor circuitry and configured to generate a power reduction value, and having an output; and multiplier circuitry having a first input coupled to the output of the controller circuitry, the multiplier circuitry configured to reduce a power of a combined radio frequency (RF) signal based on the power reduction value, the combined RF signal corresponding to the combined envelope signal.

15. The apparatus of claim 14, wherein the first band signal includes first digital samples, the apparatus including interpolation circuitry configured to generate second digital samples for the first band signal in parallel with the frequency band envelope determination circuitry determining the envelope of the first digital samples of the first band signal.

16. The apparatus of claim 14, wherein the first band signal, the second band signal, and the combined RF signal are in a digital domain.

17. The apparatus of claim 14, including second combiner circuitry having an output connected to a second input of the multiplier circuitry and configured to generate the combined RF signal based on interpolated and up-converted signals of the first band signal and the second band signal.

18. The apparatus of claim 14, including a digital-to-analog converter having an input coupled to an output of the multiplier circuitry and configured to convert the RF signal from a digital domain to an analog domain.

19. The apparatus of claim 18, including the power amplifier, the power amplifier having an input coupled to an output of the digital-to-analog converter and configured to amplify the RF signal before transmission of the RF signal.

20. The apparatus of claim 14, wherein the signal monitor circuitry is configured to determine that the combined envelope signal satisfies the damage criterion of the power amplifier after the combined envelope signal satisfies at least one of a power threshold or a duration threshold.

* * * * *